(12) United States Patent
Congdon et al.

(10) Patent No.: US 11,746,507 B2
(45) Date of Patent: Sep. 5, 2023

(54) CARBIDE CUTTER BIT WITH RIBBED SIDES AND CONICAL TIP

(71) Applicant: CATERPILLAR INC., Deerfield, IL (US)

(72) Inventors: Thomas Marshall Congdon, Dunlap, IL (US); David Bruno Parzynski, Jr., Peoria, IL (US); Nathan R. Bjerke, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 150 days.

(21) Appl. No.: 17/354,575

(22) Filed: Jun. 22, 2021

(65) Prior Publication Data

US 2021/0317741 A1     Oct. 14, 2021

Related U.S. Application Data

(62) Division of application No. 16/192,061, filed on Nov. 15, 2018, now Pat. No. 11,098,584.

(51) Int. Cl.
| | |
|---|---|
| *E02F 9/28* | (2006.01) |
| *E21C 35/183* | (2006.01) |
| *B28D 1/18* | (2006.01) |
| *G06F 30/17* | (2020.01) |
| *G06T 17/00* | (2006.01) |
| *B33Y 80/00* | (2015.01) |
| *B33Y 50/00* | (2015.01) |

(52) U.S. Cl.
CPC ............ *E02F 9/2866* (2013.01); *B28D 1/188* (2013.01); *E21C 35/183* (2013.01); *B28D 1/186* (2013.01); *B33Y 50/00* (2014.12); *B33Y 80/00* (2014.12); *G06F 30/17* (2020.01); *G06T 17/00* (2013.01)

(58) Field of Classification Search
CPC ...... E21C 35/183; G06T 17/00; E02F 9/2866; B28D 1/188
See application file for complete search history.

(56) References Cited

U.S. PATENT DOCUMENTS

| | | | |
|---|---|---|---|
| 3,830,546 | A | 8/1974 | Kniff |
| 5,324,098 | A | 6/1994 | Massa |

(Continued)

FOREIGN PATENT DOCUMENTS

| | | |
|---|---|---|
| CN | 201763340 | 3/2011 |
| CN | 103603663 | 2/2014 |

(Continued)

*Primary Examiner* — Bijan Mapar

(57) ABSTRACT

A cutter bit for a work tool on a machine includes a leading end, conical-shaped tip portion, a rearward, frustoconical-shaped tip portion extending axially rearwardly from the leading end, conical-shaped tip portion, an annular ledge extending radially outwardly from a trailing edge of the rearward, frustoconical-shaped tip portion, a frustoconical-shaped body portion extending axially rearwardly from an outer circumferential edge of the annular ledge, a cylindrical collar portion extending axially rearwardly from a trailing edge of the frustoconical-shaped body portion, and a trailing end, cylindrical-shaped shank portion extending axially rearwardly from the cylindrical collar portion. The cutter bit may also include a plurality of circumferentially-spaced ribs projecting radially outwardly from an outer peripheral surface of at least one of the leading end, conical-shaped tip portion, the rearward, frustoconical-shaped tip portion, or the frustoconical-shaped body portion.

2 Claims, 10 Drawing Sheets

(56) References Cited

U.S. PATENT DOCUMENTS

| | | |
|---|---|---|
| 5,551,760 A | 9/1996 | Sollami |
| 5,806,215 A | 9/1998 | Matthews |
| 6,019,434 A | 2/2000 | Emmerich |
| 6,196,636 B1 | 3/2001 | Mills |
| 6,341,823 B1 | 1/2002 | Sollami |
| 7,455,484 B2 | 11/2008 | Bauschulte et al. |
| 9,909,285 B2 | 3/2018 | Bjerke et al. |
| 10,876,401 B1 | 12/2020 | Taitt |
| 2002/0164215 A1 | 11/2002 | Bauschulte |
| 2010/0109418 A1 | 5/2010 | Greenspan |
| 2010/0320003 A1 | 12/2010 | Sollami et al. |
| 2012/0104830 A1 | 5/2012 | Monyak |
| 2013/0269221 A1 | 10/2013 | Pippins |
| 2015/0091365 A1 | 4/2015 | Laux |
| 2018/0245467 A1 | 8/2018 | Kenno |

FOREIGN PATENT DOCUMENTS

| | | |
|---|---|---|
| CN | 204082144 | 1/2015 |
| CN | 107060753 | 8/2017 |
| EP | 0908601 | 4/1999 |
| WO | WO 9413932 | 6/1994 |
| WO | WO 2012075672 A1 | 6/2012 |
| WO | WO 2018095955 A1 | 5/2018 |

CARBIDE CUTTER BIT WITH RIBBED SIDES AND CONICAL TIP

CROSS-REFERENCE TO RELATED APPLICATIONS

The present application is a divisional of U.S. patent application Ser. No. 16/192,061, filed Nov. 15, 2018, the entire contents of which is expressly incorporated herein in its entirety for all purposes by this reference.

TECHNICAL FIELD

The present disclosure relates generally to a cutter bit, and more particularly, to a cutter bit with ribbed sides and a conical tip.

BACKGROUND

Earth working machines and mining machines used in applications such as road resurfacing and longwall mining may include multiple cutter bits, also referred to as "picks". The cutter bits or picks are designed to be held in mounting blocks that are affixed to a movable member of a machine, such as a rotary cutting drum on a motor grader used in road resurfacing operations, and a rotary cutting head mounted on a linear guide of a longwall shearer used in longwall mining operations. These machines include multiple tools having cutting edge components such as the cutter bits or picks configured to contact and displace a substrate material being processed. For example, motor graders are typically used to perform displacement, distribution and leveling of ground material, such as rock and/or soil. The motor graders may move the rotary cutting drum over the ground so that the cutting edge components engage with the rock and/or soil so as to displace, distribute, or level the rock and/or soil. Different forms of equipment and machinery can also be employed for mining and excavation operations. The type of mining or excavation taking place generally dictates the type of equipment and machinery that is appropriate.

Equipment used to mine or excavate in hard substances, such as coal faces, or to perform road resurfacing operations on existing compacted earth, concrete, or asphalt pavement surfaces can include rotary cutting heads or drums carrying a plurality of projecting cutter bits or picks that are brought into engagement with the hard substances. The cutter bits or picks bite into the hard substance as they rotate with the head or drum, and impact against the substance to dislodge or fragment the substance from the surface. This highly aggressive engagement between the cutter bits or picks and the hard substance can result in rapid abrasion of the cutting edges of the cutter bits or picks, as well as the generation of sparks, which may present a hazardous situation.

Cutter bits or picks are a consumable component of the overall apparatus used to break a substrate into a plurality of pieces. For example, a typical cutter bit comprises an elongate steel bit body with an axially forward end and an axially rearward end. The cutter bit contains a means for retaining the bit in the bore of a block such as a split sleeve retainer. The block mounts on a rotatable drum driven by a machine. A hard cutting insert, typically made from a cemented tungsten carbide (WC—Co alloy) having a cobalt content ranging from about 5 to about 13 weight percent, affixes to the forward end of the cutter bit. Typically, one brazes the hard cutting insert to the steel bit body. The hard cutting insert is the component of the cutter bit that first impinges upon the substrate. Thus, the shape and configuration of the hard cutting insert and the influence the shape and configuration of the hard cutting insert has on the performance of the cutter bit are factors that are considered in the design of the cutter bits.

One early cutting insert has a conical tip portion which joins to a cylindrical portion. The cylindrical portion mounts in a cylindrical bore at the axially forward end of a steel bit body. U.S. Pat. No. 3,830,546 to Kniff shows one example of such a hard cutting insert. The bit in the '546 patent has a forward working portion tapering inwardly to a pointed end, and the pointed end is provided with an insert formed of cemented hard metal carbide or tungsten carbide, for example. While the wear component of the '546 patent may strengthen the overall toughness and abrasion resistance of a work tool used on earth moving equipment, the configuration of the cutter bit with a hard cutting insert and the complexities in the process of forming such a bit may be prohibitively expensive and result in excessive downtime during repair or replacement of the wear component. Moreover, the cutter bit of the '546 patent may wear unevenly, thus unnecessarily shortening the life expectancy of the cutter bit.

The disclosed cutter bit is directed to overcoming one or more of the problems set forth above and other problems associated with conventional cutter bits or picks configured to be mounted on rotary cutting drums or cutting heads of machines used to mine or excavate hard substances.

SUMMARY

In one aspect, the present disclosure is directed to a cutter bit for a work tool on a machine. The cutter bit may include a leading end, conical-shaped tip portion, a rearward, frustoconical-shaped tip portion extending axially rearwardly from the leading end, conical-shaped tip portion, an annular ledge extending radially outwardly from a trailing edge of the rearward, frustoconical-shaped tip portion, a frustoconical-shaped body portion extending axially rearwardly from an outer circumferential edge of the annular ledge, a cylindrical collar portion extending axially rearwardly from a trailing edge of the frustoconical-shaped body portion, and a trailing end, cylindrical-shaped shank portion extending axially rearwardly from the cylindrical collar portion. The cutter bit may also include a plurality of circumferentially-spaced ribs projecting radially outwardly from an outer peripheral surface of at least one of the leading end, conical-shaped tip portion, the rearward, frustoconical-shaped tip portion, or the frustoconical-shaped body portion.

In another aspect, the present disclosure is directed to a cutter bit for a work tool on a machine. The cutter bit may include a leading end, conical-shaped tip portion, a rearward, frustoconical-shaped tip portion extending axially rearwardly from the leading end, conical-shaped tip portion, an annular ledge extending radially outwardly from a trailing edge of the rearward, frustoconical-shaped tip portion, a frustoconical-shaped body portion extending axially rearwardly from an outer circumferential edge of the annular ledge, a cylindrical collar portion extending axially rearwardly from a trailing edge of the frustoconical-shaped body portion, and a trailing end, cylindrical-shaped shank portion extending axially rearwardly from the cylindrical collar portion. The cutter bit may also include a plurality of circumferentially-spaced ribs projecting radially outwardly from an outer peripheral surface of each of the leading end, conical-shaped tip portion, the rearward, frustoconical-shaped tip portion, and the frustoconical-shaped body portion.

In another aspect, the present disclosure is directed to a rotatable cutter bit configured for mounting on a rotary cutting drum of a machine. The rotatable cutter bit may include a leading end, conical-shaped tip portion, a rearward, frustoconical-shaped tip portion extending axially rearwardly from the leading end, conical-shaped tip portion, an annular ledge extending radially outwardly from a trailing edge of the rearward, frustoconical-shaped tip portion, a frustoconical-shaped body portion extending axially rearwardly from an outer circumferential edge of the annular ledge, a cylindrical collar portion extending axially rearwardly from a trailing edge of the frustoconical-shaped body portion, and a trailing end, cylindrical-shaped shank portion extending axially rearwardly from the cylindrical collar portion. The rotatable cutter bit may also include a plurality of circumferentially-spaced ribs projecting radially outwardly from an outer peripheral surface of the leading end, conical-shaped tip portion, and the rearward, frustoconical-shaped tip portion, and an outer peripheral surface of the frustoconical-shaped body portion being smooth and devoid of any projecting ribs.

DETAILED DESCRIPTION

Figure 1:
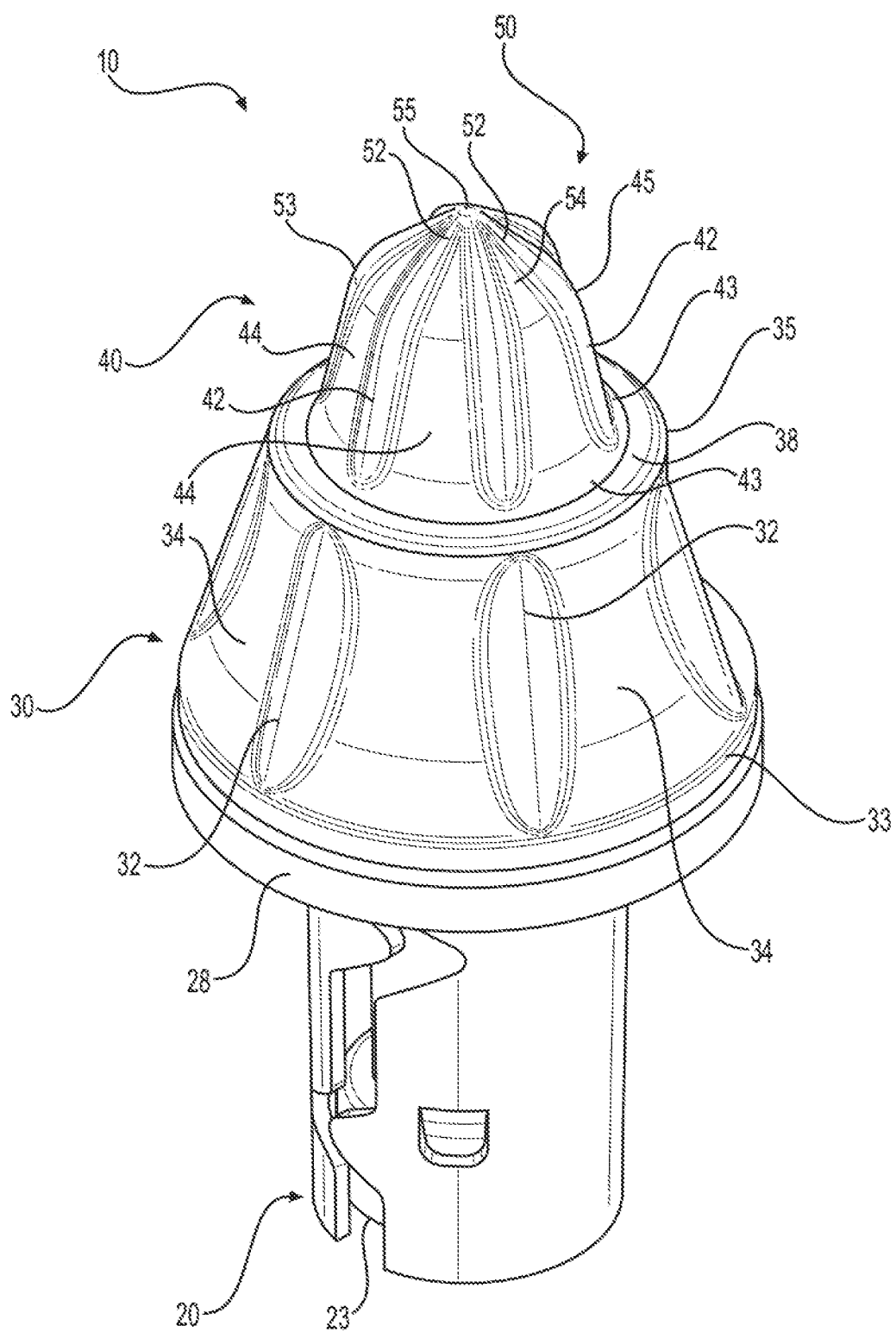
FIG. 1 is a perspective view of a cutter bit, according to a first exemplary embodiment.
Figure 2:
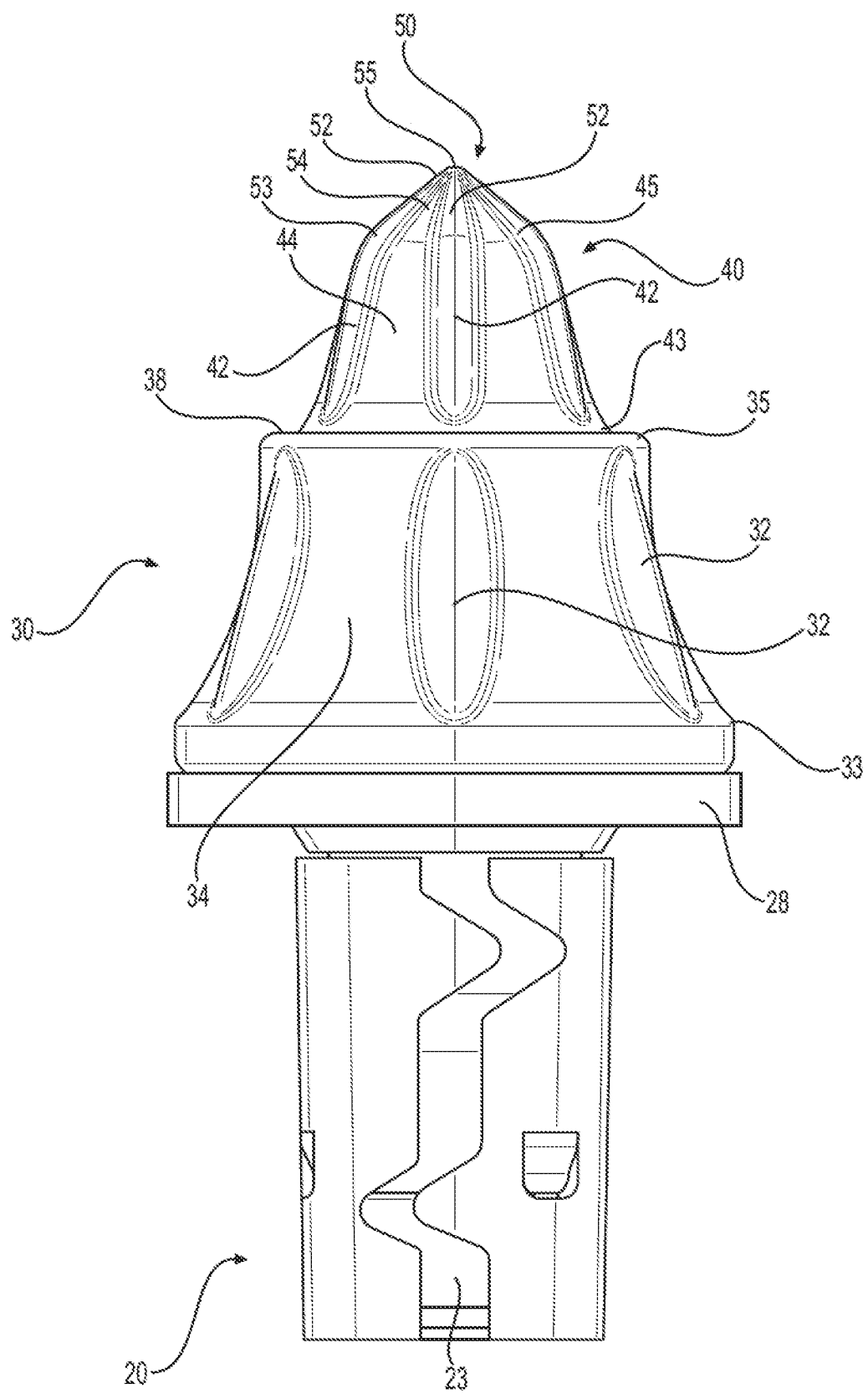
FIG. 2 is a side elevation view of the cutter bit of FIG. 1.
Figure 3:
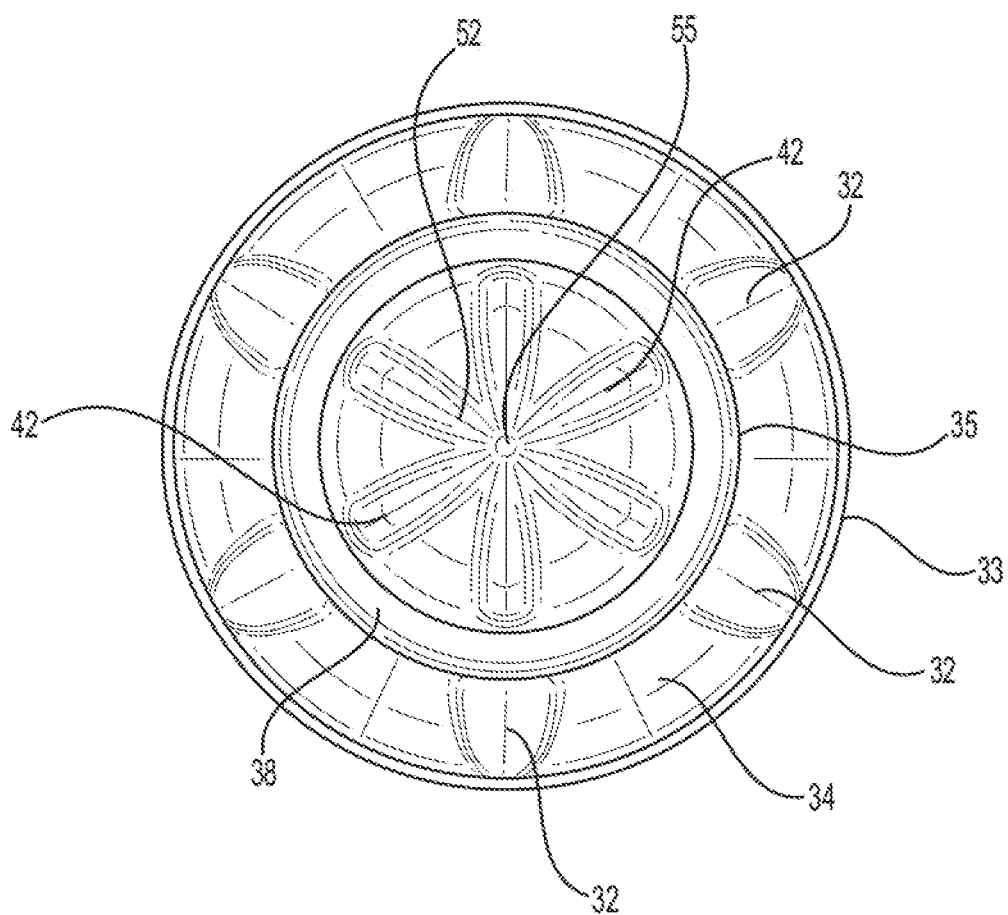
FIG. 3 is a leading end plan view of the cutter bit of FIG. 1.

A cutter bit 10 according to an exemplary embodiment of this disclosure is illustrated in FIGS. 1-3. Cutter bit 10 is configured for rotatable mounting on a work tool such as a rotary cutting head on a longwall mining machine or a rotary cutting drum on a motor grader used in a road resurfacing operation. Cutter bit 10 may include a leading end, conical-shaped tip portion 50 extending rearwardly from an apex 55 to a rearward edge 53 of leading end, conical-shaped tip portion 50. Cutter bit 10 may also include a rearward, frustoconical-shaped tip portion 40 extending axially rearwardly from a leading edge 45 at leading end, conical-shaped tip portion 50 to a trailing edge 43. Cutter bit 10 may further include an annular ledge 38 extending radially outwardly from trailing edge 43 of rearward, frustoconical-shaped tip portion 40. A frustoconical-shaped body portion 30 may extend axially rearwardly from an outer circumferential edge 35 of annular ledge 38 to a trailing edge 33. A cylindrical collar portion 28 may extend axially rearwardly from trailing edge 33 of frustoconical-shaped body portion 30. A trailing end, cylindrical-shaped shank portion 20 may extend axially rearwardly from cylindrical collar portion 28.

Shank portion 20 may include a connection mechanism 23 for connecting cutter bit 10 to a rotary cutting drum or rotary cutting head. As shown in FIGS. 1-3, cutter bit 10 may also include a plurality of circumferentially-spaced ribs 52, 42, 32 projecting radially outwardly from a respective outer peripheral surface of at least one of leading end, conical-shaped tip portion 50, rearward, frustoconical-shaped tip portion 40, or frustoconical-shaped body portion 30, respectively. References to a "leading edge" or "leading end" throughout this specification means an edge or end of a portion or section of the cutter bit that is closer to a pointed tip or apex of the cutter bit, while a "trailing edge" or "trailing end" refers to an edge or end that is closer to the shank portion for connecting the cutter bit to a rotary drum or cutting head. Similarly, "rearward" refers to a portion or section of the cutter bit that is closer to the shank portion for connecting the cutter bit to a rotary drum or cutting head. "Frustoconical-shaped" refers to the shape of a frustum of a cone, which is a part of a solid conical figure contained between two parallel planes. The apex of a conical figure is the pointed end of the cone.

Cutter bit 10 of FIGS. 1-3 may be configured as shown with an outer peripheral surface 34 of frustoconical-shaped body portion 30 including a concave profile in an axial direction of cutter bit 10. Similarly, an outer peripheral surface 44 of rearward, frustoconical-shaped tip portion 40 may include at least a portion of outer peripheral surface 44 with a concave profile in an axial direction of cutter bit 10. The concave profile or profiles along outer peripheral surfaces of cutter bit 10, in combination with the presence of a plurality of circumferentially-spaced ribs, as discussed below, may enhance the ability of cutter bit 10 to shed fragments of a substance being excavated by cutter bit 10 and reduce wear on cutter bit 10.

Cutter bit 10 may include circumferentially-spaced ribs 52, 42, 32 extending in an axial direction of cutter bit 10 between a leading end and a trailing end of at least one of leading end, conical-shaped tip portion 50, rearward, frustoconical-shaped tip portion 40, or frustoconical-shaped body portion 30. As further shown in FIGS. 1-3, circumferentially-spaced ribs 52, 42, 32 extend in the axial direction and in a radial direction of cutter bit 10 such that each of the circumferentially-spaced ribs has an axial and radial slope directed toward apex 55 of leading end, conical-shaped tip portion 50. In the exemplary embodiment of FIGS. 1-3, circumferentially-spaced ribs 42 of rearward, frustoconical-shaped tip portion 40 are contiguous with and/or merged with corresponding circumferentially-spaced ribs 52 of leading end, conical-shaped tip portion 50. Circumferentially-spaced ribs 42 slope axially and radially inwardly at a first angle relative to a central axis of cutter bit 10, and merge with circumferentially-spaced ribs 52 of leading end, conical-shaped tip portion 50. Circumferentially-spaced ribs 52 of leading end, conical-shaped tip portion 50 slope axially and radially inwardly at a second angle greater than the first angle relative to the central axis of cutter bit 10. Circumferentially-spaced ribs 52 of leading end, conical-shaped tip portion 50 converge together at apex 55 of leading end, conical-shaped tip portion 50.

Each of circumferentially-spaced ribs 52, 42, 32 may be axially symmetrical such that a cross-sectional profile of each respective one of the circumferentially-spaced ribs is the same on each of opposite sides of a line that bisects each respective rib and extends in an axial direction of the cutter bit. Each of the circumferentially-spaced ribs may also include a profile that is radially inwardly convex along at least a portion of the axial length of the respective rib.

Alternatively, each of the circumferentially-spaced ribs may be radially inwardly convex along a first portion of its respective axial length and radially inwardly concave along a second portion of its respective axial length. Hence, as best seen on the profile of circumferentially-spaced ribs 42 of rearward, frustoconical-shaped tip portion 40 adjacent trailing edge 43, at least a portion of each rib may smoothly transition from a profile that includes a radially inwardly directed cup-shape to a profile that includes a radially outwardly directed cup-shape. In various exemplary embodiments, the axially symmetrical profile of the circumferentially-spaced ribs may be desirable for certain applications, while an axially asymmetrical profile may be desirable for other applications.

Circumferentially-spaced ribs 52, 42, 32 enhance rotation of cutter bit 10 as fragments or chips broken away from a substrate by engagement between cutter bit 10 and the substrate flow over outer peripheral surfaces 54 of leading edge, conical-shaped tip portion 50 in between ribs 52, outer peripheral surfaces 44 of rearward, frustoconical-shaped tip portion 40 in between ribs 42, and outer peripheral surfaces 34 of frustoconical-shaped body portion 30 in between ribs 32. The fragments or chips encourage rotation of cutter bit 10 about its central axis, thereby encouraging more even wear of cutter bit 10 about its central axis during use and reducing the occurrence of sparking caused by friction between the fragments or chips and portions of cutter bit 10.

In the exemplary embodiments of the figures, six of the circumferentially-spaced ribs are evenly spaced around at least one of leading end, conical-shaped tip portion 50, rearward, frustoconical-shaped tip portion 40, or frustoconical-shaped body portion 30. One of ordinary skill in the art will recognize that a different number of circumferentially-spaced ribs may be provided around the respective portions of cutter bit 10, depending on the various applications, substrate materials that will be worked on, size of cutter bit 10, materials from which cutter bit 10 is manufactured, speed of rotation of a movable member of a machine on which the cutter bits are mounted, and other factors.

Figure 4:
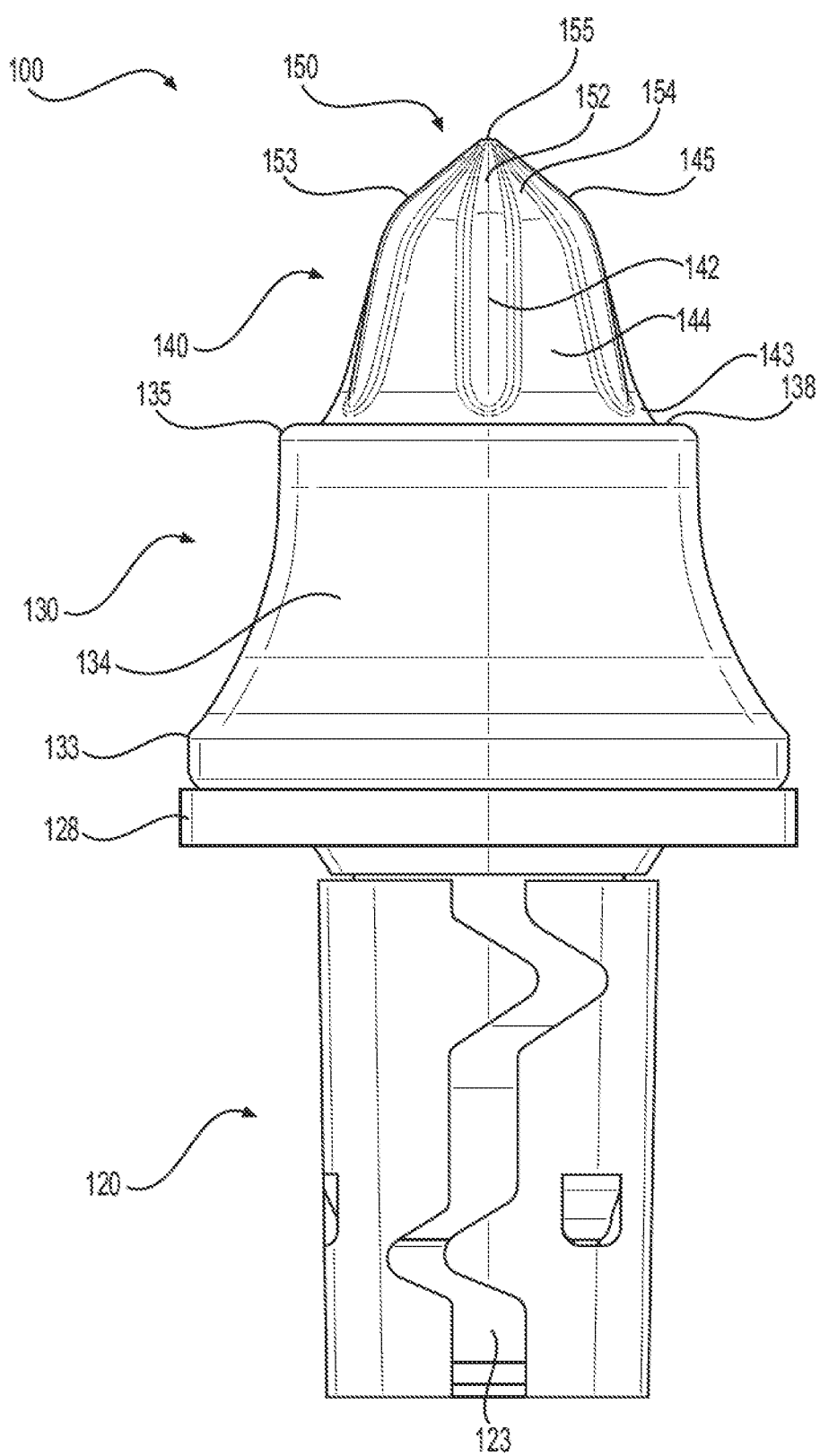
FIG. 4 is a side elevation view of a cutter bit, according to a second exemplary embodiment.
Figure 5:
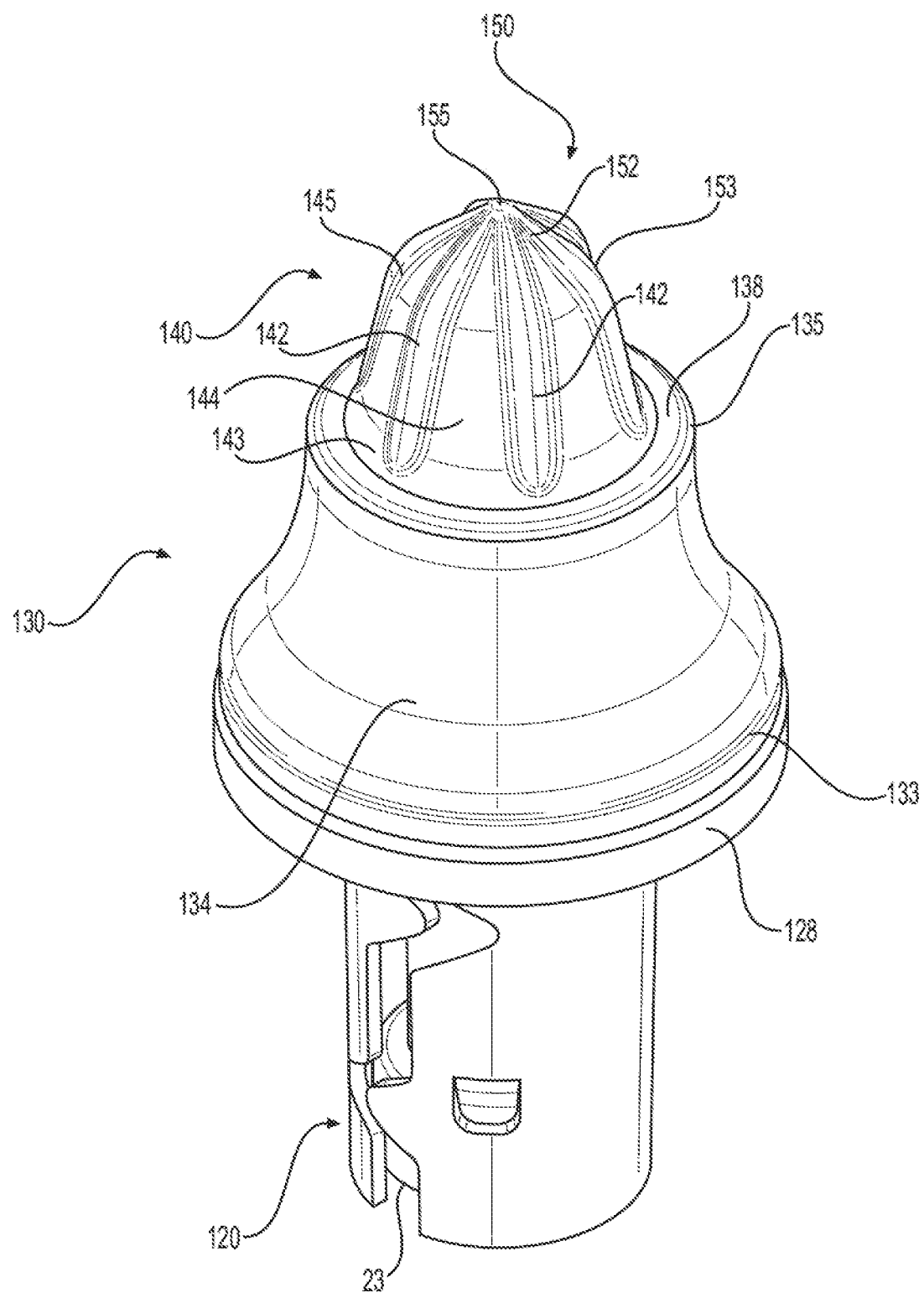
FIG. 5 is a perspective view of the cutter bit of FIG. 4.
Figure 6:
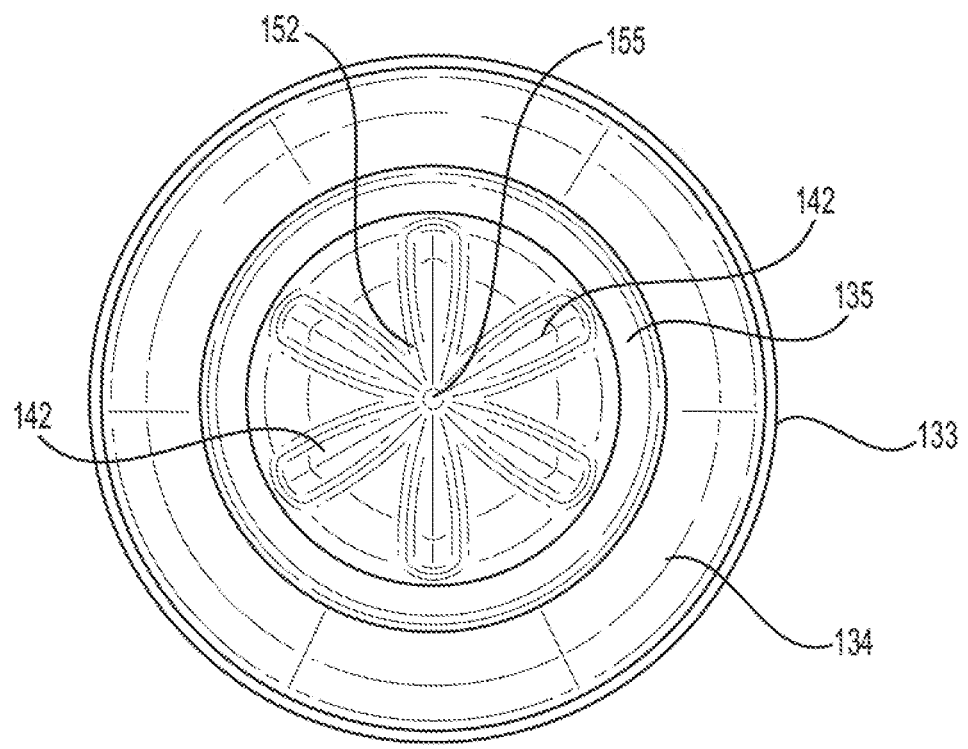
FIG. 6 is a leading end plan view of the cutter bit of FIG. 4.

In another exemplary embodiment illustrated in FIGS. 4-6, a cutter bit 100 may include a leading end, conical-shaped tip portion 150 extending rearwardly from an apex 155 to a rearward edge 153 of leading end, conical-shaped tip portion 150. Cutter bit 100 may also include a rearward, frustoconical-shaped tip portion 140 extending axially rearwardly from a leading edge 145 at leading end, conical-shaped tip portion 150 to a trailing edge 143. Cutter bit 100 may further include an annular ledge 138 extending radially outwardly from trailing edge 143 of rearward, frustoconical-shaped tip portion 140. A frustoconical-shaped body portion 130 may extend axially rearwardly from an outer circumferential edge 135 of annular ledge 138 to a trailing edge 133. A cylindrical collar portion 128 may extend axially rearwardly from trailing edge 133 of frustoconical-shaped body portion 130. A trailing end, cylindrical-shaped shank portion 120 may extend axially rearwardly from cylindrical collar portion 128. Shank portion 120 may include a connection mechanism 123 for connecting cutter bit 100 to a rotary cutting drum or rotary cutting head. As shown in FIGS. 4-6, exemplary cutter bit 100 may also include a plurality of circumferentially-spaced ribs 152, 142 projecting radially outwardly from a respective outer peripheral surface of each of leading end, conical-shaped tip portion 150 and rearward, frustoconical-shaped tip portion 140, respectively.

Cutter bit 100 of FIGS. 4-6 may be configured as shown with an outer peripheral surface 134 of frustoconical-shaped body portion 130 including a concave profile in an axial direction of cutter bit 100. Similarly, an outer peripheral surface 144 of rearward, frustoconical-shaped tip portion 140 may include at least a portion of outer peripheral surface 144 with a concave profile in an axial direction of cutter bit 100. The concave profile or profiles along outer peripheral surfaces of cutter bit 100, in combination with the presence of a plurality of circumferentially-spaced ribs, as discussed below, may enhance the ability of cutter bit 100 to shed fragments of a substance being excavated by cutter bit 100 and reduce wear on cutter bit 100.

Cutter bit 100 may include circumferentially-spaced ribs 152, 142 extending in an axial direction of cutter bit 100 between a leading end and a trailing end of each of leading end, conical-shaped tip portion 150 and rearward, frustoconical-shaped tip portion 140. Frustoconical-shaped body portion 130 of cutter bit 100 may be devoid of any ribs along its outer peripheral surface 134. As further shown in FIGS. 4-6, circumferentially-spaced ribs 152, 142 extend in the axial direction and in a radial direction of cutter bit 100 such that each of the circumferentially-spaced ribs has an axial and radial slope directed toward apex 155 of leading end, conical-shaped tip portion 150. In the exemplary embodiment of FIGS. 4-6, circumferentially-spaced ribs 142 of rearward, frustoconical-shaped tip portion 140 are contiguous with and/or merged with corresponding circumferentially-spaced ribs 152 of leading end, conical-shaped tip portion 150. Circumferentially-spaced ribs 142 slope axially and radially inwardly at a first angle relative to a central axis of cutter bit 100, and merge with circumferentially-spaced ribs 152 of leading end, conical-shaped tip portion 150, which slope axially and radially inwardly at a second angle greater than the first angle relative to the central axis of cutter bit 100. Circumferentially-spaced ribs 152 of leading end, conical-shaped tip portion 150 converge together at apex 155 of leading end, conical-shaped tip portion 150.

Each of circumferentially-spaced ribs 152, 142 may be axially symmetrical such that a cross-sectional profile of each respective one of the circumferentially-spaced ribs is the same on each of opposite sides of a line that bisects each respective rib and extends in an axial direction of the cutter bit. Each of the circumferentially-spaced ribs may also include a profile that is radially inwardly convex along at least a portion of the axial length of the respective rib. Alternatively, each of the circumferentially-spaced ribs may be radially inwardly convex along a first portion of its respective axial length and radially inwardly concave along a second portion of its respective axial length. Hence, as best seen on the profile of circumferentially-spaced ribs 142 of rearward, frustoconical-shaped tip portion 140 adjacent trailing edge 143, at least a portion of each rib may smoothly transition from a profile that includes a radially inwardly directed cup-shape to a profile that includes a radially outwardly directed cup-shape. In various exemplary embodiments, the axially symmetrical profile of the circumferentially-spaced ribs may be desirable for certain applications, while an axially asymmetrical profile may be desirable for other applications.

Circumferentially-spaced ribs 152, 142 enhance rotation of cutter bit 100 as fragments or chips broken away from a substrate by engagement between cutter bit 100 and the substrate flow over outer peripheral surfaces 154 of leading edge, conical-shaped tip portion 150 in between ribs 152, and outer peripheral surfaces 144 of rearward, frustoconical-shaped tip portion 140 in between ribs 142. The fragments or chips encourage rotation of cutter bit 100 about its central axis, thereby encouraging more even wear of cutter bit 100 about its central axis and reducing the occurrence of sparking caused by friction between the fragments or chips and portions of cutter bit 100.

As with the embodiment of FIGS. 1-3, the disclosed exemplary cutter bit 100 of FIGS. 4-6 may be manufactured using conventional techniques such as, for example, casting or molding. Alternatively, the disclosed cutter bit may be manufactured using conventional techniques generally referred to as additive manufacturing or additive fabrication. Known additive manufacturing/fabrication processes include techniques such as, for example, 3D printing.

Figure 7:
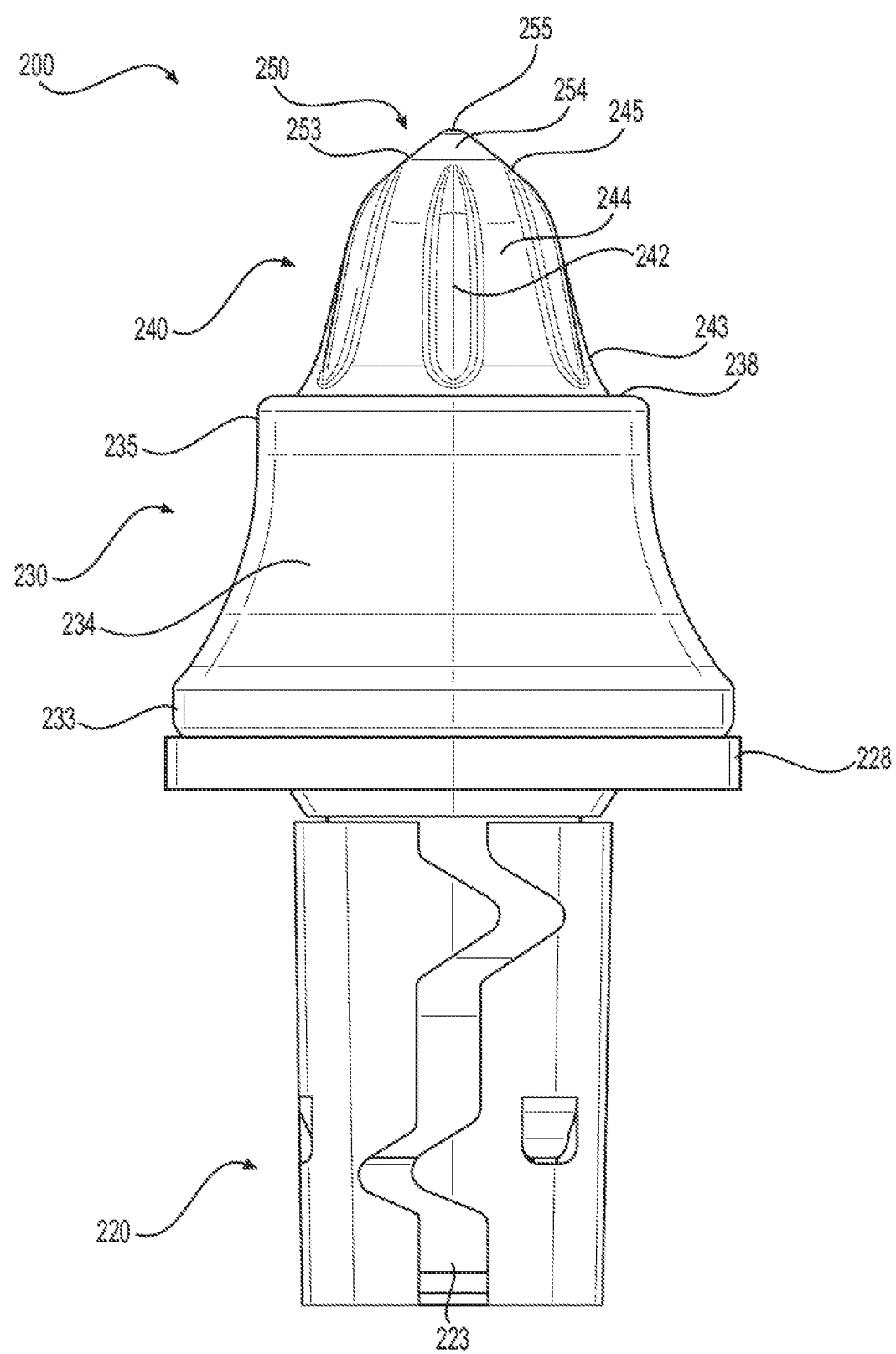
FIG. 7 is a side elevation view of a cutter bit, according to a third exemplary embodiment.
Figure 8:
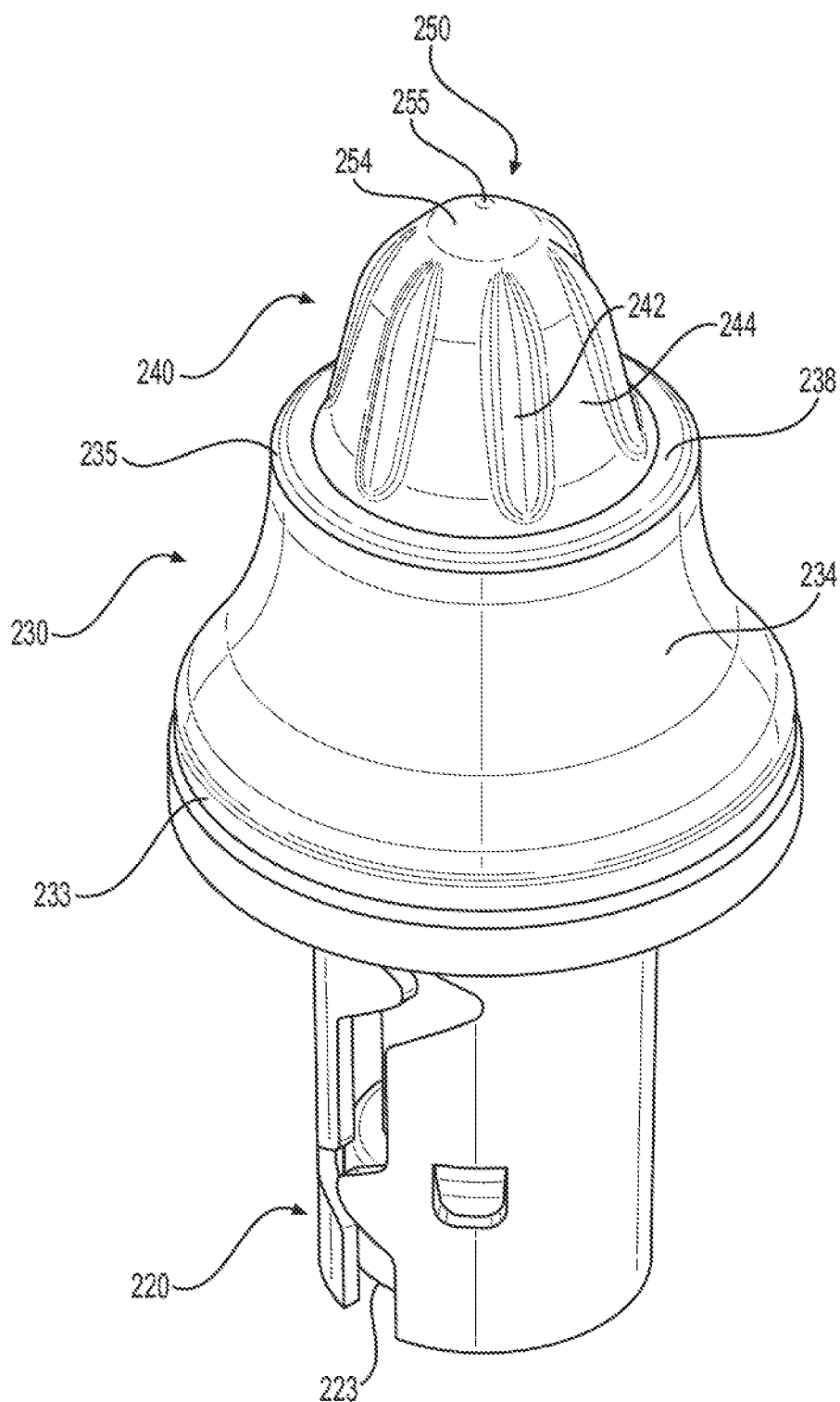
FIG. 8 is a perspective view of the cutter bit of FIG. 7.
Figure 9:
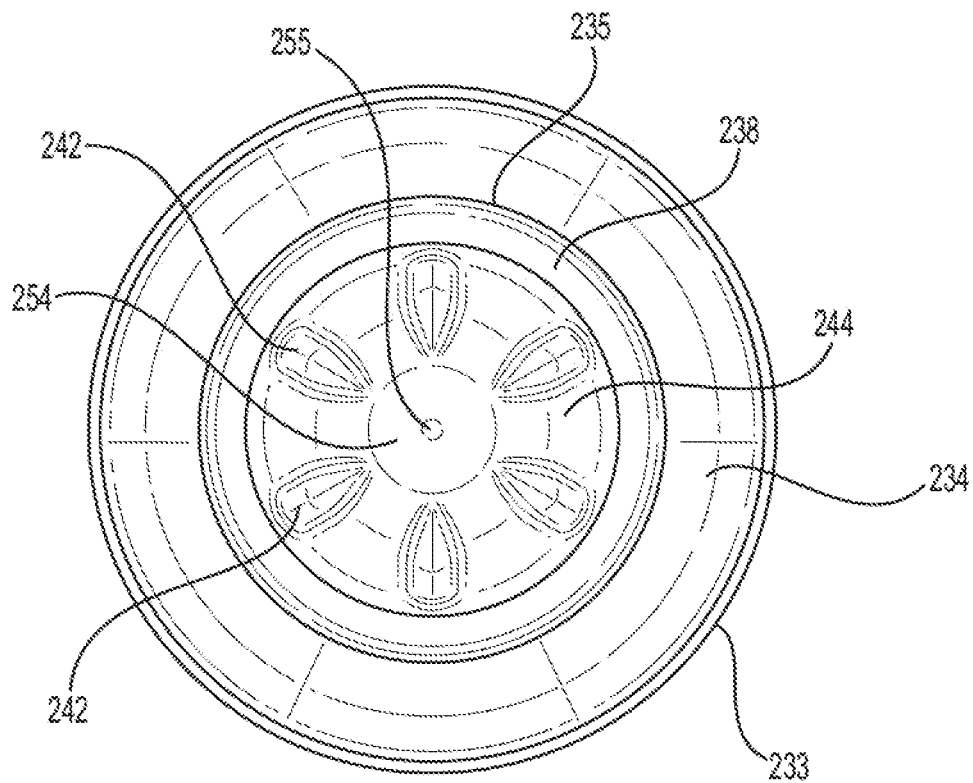
FIG. 9 is a leading end plan view of the cutter bit of FIG. 7.

In yet another exemplary embodiment illustrated in FIGS. 7-9, a cutter bit 200 may include a leading end, conical-shaped tip portion 250 extending rearwardly from an apex 255 to a rearward edge 253 of leading end, conical-shaped tip portion 250. Cutter bit 200 may also include a rearward, frustoconical-shaped tip portion 240 extending axially rearwardly from a leading edge 245 at leading end, conical-shaped tip portion 250 to a trailing edge 243. Cutter bit 200 may further include an annular ledge 238 extending radially outwardly from trailing edge 243 of rearward, frustoconical-shaped tip portion 240. A frustoconical-shaped body portion 230 may extend axially rearwardly from an outer circumferential edge 235 of annular ledge 238 to a trailing edge 233. A cylindrical collar portion 228 may extend axially rearwardly from trailing edge 233 of frustoconical-shaped body portion 230. A trailing end, cylindrical-shaped shank portion 220 may extend axially rearwardly from cylindrical collar portion 228. Shank portion 220 may include a connection mechanism 223 for connecting cutter bit 200 to a rotary cutting drum or rotary cutting head. As shown in FIGS. 7-9, exemplary cutter bit 200 may also include a plurality of circumferentially-spaced ribs 242 projecting radially outwardly from an outer peripheral surface 244 of rearward, frustoconical-shaped tip portion 240. In the exemplary embodiment of cutter bit 200 shown in FIGS. 7-9, leading end, conical-shaped tip portion 250 and frustoconical-shaped body portion 230 are devoid of any ribs.

Cutter bit 200 of FIGS. 7-9 may be configured as shown with an outer peripheral surface 234 of frustoconical-shaped body portion 230 including a concave profile in an axial direction of cutter bit 200. Similarly, outer peripheral surface 244 of rearward, frustoconical-shaped tip portion 240 may include at least a portion of outer peripheral surface 244 with a concave profile in an axial direction of cutter bit 200. The concave profile or profiles along outer peripheral surfaces of cutter bit 200, in combination with the presence of a plurality of circumferentially-spaced ribs, as discussed below, may enhance the ability of cutter bit 200 to shed fragments of a substance being excavated by cutter bit 200 and reduce wear on cutter bit 200.

Cutter bit 200 may include circumferentially-spaced ribs 242 extending in an axial direction of cutter bit 200 between a leading end and a trailing end of rearward, frustoconical-shaped tip portion 240. As further shown in FIGS. 7-9, circumferentially-spaced ribs 142 extend in the axial direction and in a radial direction of cutter bit 200 such that each of the circumferentially-spaced ribs has an axial and radial slope directed toward apex 255 of leading end, conical-shaped tip portion 250. In the exemplary embodiment of FIGS. 7-9, circumferentially-spaced ribs 242 of rearward, frustoconical-shaped tip portion 240 slope axially and radially inwardly at an acute angle relative to a central axis of cutter bit 200. Leading end, conical-shaped tip portion 250 is configured with a smooth conical surface 254 extending from apex 255 to rearward edge 253.

Each of circumferentially-spaced ribs 242 may be axially symmetrical such that a cross-sectional profile of each respective one of the circumferentially-spaced ribs is the same on each of opposite sides of a line that bisects each respective rib and extends in an axial direction of the cutter bit. Each of the circumferentially-spaced ribs may also include a profile that is radially inwardly convex along at least a portion of the axial length of the respective rib. Alternatively, each of the circumferentially-spaced ribs may be radially inwardly convex along a first portion of its respective axial length and radially inwardly concave along a second portion of its respective axial length. Hence, as best seen on the profile of circumferentially-spaced ribs 242 of rearward, frustoconical-shaped tip portion 240 adjacent trailing edge 243, at least a portion of each rib may smoothly transition from a profile including a radially inwardly directed cup-shape to a profile including a radially outwardly directed cup-shape. In various exemplary embodiments, the axially symmetrical profile of the circumferentially-spaced ribs may be desirable for certain applications, while an axially asymmetrical profile may be desirable for other applications.

Circumferentially-spaced ribs 242 enhance rotation of cutter bit 200 as fragments or chips broken away from a substrate by engagement between cutter bit 200 and the substrate flow over outer peripheral surfaces 244 of rearward, frustoconical-shaped tip portion 240 in between ribs 242. The fragments or chips encourage rotation of cutter bit 200 about its central axis, thereby encouraging more even wear of cutter bit 200 about its central axis and reducing the occurrence of sparking caused by friction between the fragments or chips and portions of cutter bit 200.

INDUSTRIAL APPLICABILITY

The disclosed exemplary cutter bits 10, 100, and 200 of FIGS. 1-9 may be manufactured using conventional techniques such as, for example, casting or molding. Alternatively, the disclosed cutter bits may be manufactured entirely or in part using techniques generally referred to as additive manufacturing or additive fabrication. In each of the exemplary embodiments of cutter bits 10, 100, and 200, the respective leading end, conical-shaped tip portion, and/or the respective rearward, frustoconical-shaped tip portion may include tabs or other protrusions (not seen) that are used in the brazing or other joining procedures for assembling the respective tip portion to the respective body and shank of the cutter bit.

A cutter bit configured according to the various exemplary embodiments of this disclosure may advantageously encourage rotation of the bit while in use as a result of the flow of the fragments or chips of a substrate material dislodged by the cutter bit across the outer peripheral surfaces of the cutter bit and against the plurality of circumferentially spaced ribs. The circumferentially spaced ribs may also prevent the cutter bit from becoming frozen in place and failing to rotate relative to its holder during use. In various applications it may be desirable to provide a smooth leading end, conical-shaped tip portion, with ribs only provided along a rearward, frustoconical-shaped tip portion and/or a frustoconical-shaped body portion located rearward of the tip portion. The smooth, leading end, conical-shaped tip portion may enhance the ability of the cutter bit to penetrate certain substrates, and may encourage fragments and chips from the substrate to move more quickly into engagement with ribs positioned along the outer peripheral surface of the rearward, frustoconical-shaped tip portion. In other applications, the presence of axially extending ribs along the outer peripheral surfaces of the leading end, conical-shaped tip portion, the rearward, frustoconical-shaped tip portion, and the frustoconical-shaped body portion, or just along the rearward, frustoconical-shaped tip portion, may provide the best combination for effective and efficient removal of substrate material and rotation of the cutter bit.

The entire cutter bit according to various exemplary embodiments of this disclosure, or only portions of the cutter bit such as the leading end, conical-shaped tip portion, may be manufactured using 3D printing techniques. 3D printing is an additive manufacturing process wherein material may be deposited in successive layers under the control of a computer. The computer controls additive fabrication equipment to deposit the successive layers according to a three-dimensional model (e.g. a digital file such as an AMF or STL file) that is configured to be converted into a plurality of slices, for example substantially two-dimensional slices, that each define a cross-sectional layer of the cutter bit or a portion of the cutter bit in order to manufacture, or fabricate, the cutter bit. In one case, the disclosed cutter bit or portion of a cutter bit would be an original component and the 3D printing process would be utilized to manufacture the part. In other cases, the 3D process could be used to replicate an existing cutter bit and the replicated cutter bit could be sold as aftermarket parts. These replicated aftermarket cutter bit could be either exact copies of the original cutter bit or pseudo copies differing in only non-critical aspects.

Figure 10:
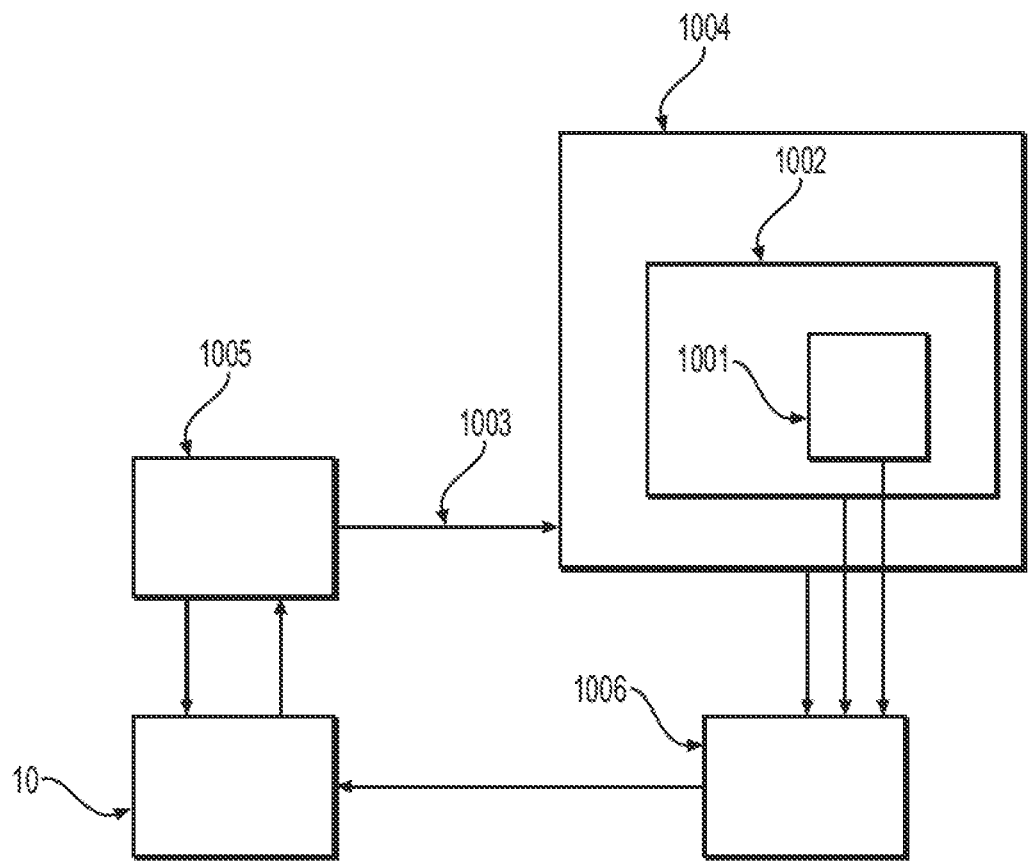
FIG. 10 is a schematic drawing representing a system for generating a three-dimensional model of one or more portions of a cutter bit, according to any one or more of the exemplary disclosed embodiments.

With reference to FIG. 10, the three-dimensional model 1001 used to represent an original cutter bit may be on a computer-readable storage medium 1002 such as, for example, magnetic storage including floppy disk, hard disk, or magnetic tape; semiconductor storage such as solid state disk (SSD) or flash memory; optical disc storage; magneto-optical disc storage; or any other type of physical memory on which information or data readable by at least one processor may be stored. This storage medium may be used in connection with commercially available 3D printers 1006 to manufacture, or fabricate, the cutter bit. Alternatively, the three-dimensional model may be transmitted electronically to the 3D printer 1006 in a streaming fashion without being permanently stored at the location of the 3D printer 1006. In either case, the three-dimensional model constitutes a digital representation of the cutter bit suitable for use in manufacturing the cutter bit.

The three-dimensional model may be formed in a number of known ways. In general, the three-dimensional model is created by inputting data 1003 representing the cutter bit to a computer or a processor 1004 such as a cloud-based software operating system. The data may then be used as a three-dimensional model representing the physical cutter bit. The three-dimensional model is intended to be suitable for the purposes of manufacturing the cutter bit. In an exemplary embodiment, the three-dimensional model is suitable for the purpose of manufacturing the cutter bit by an additive manufacturing technique.

In one embodiment depicted in FIG. 10, the inputting of data may be achieved with a 3D scanner 1005. The method may involve contacting the cutter bit via a contacting and data receiving device and receiving data from the contacting in order to generate the three-dimensional model. For example, 3D scanner 1005 may be a contact-type scanner. The scanned data may be imported into a 3D modeling software program to prepare a digital data set. In one embodiment, the contacting may occur via direct physical contact using a coordinate measuring machine that measures the physical structure of the cutter bit by contacting a probe with the surfaces of the cutter bit in order to generate a three-dimensional model. In other embodiments, the 3D scanner 1005 may be a non-contact type scanner and the method may include directing projected energy (e.g. light or ultrasonic) onto the cutter bit to be replicated and receiving the reflected energy. From this reflected energy, a computer would generate a computer-readable three-dimensional model for use in manufacturing the cutter bit. In various embodiments, multiple 2D images can be used to create a three-dimensional model. For example, 2D slices of a 3D object can be combined to create the three-dimensional model. In lieu of a 3D scanner, the inputting of data may be done using computer-aided design (CAD) software. In this case, the three-dimensional model may be formed by generating a virtual 3D model of the disclosed cutter bit using the CAD software. A three-dimensional model would be generated from the CAD virtual 3D model in order to manufacture the cutter bit.

The additive manufacturing process utilized to create the disclosed cutter bit may involve materials such as plastic, rubber, metal, etc. In some embodiments, additional processes may be performed to create a finished product. Such additional processes may include, for example, one or more of cleaning, hardening, heat treatment, material removal, and polishing. Other processes necessary to complete a finished product may be performed in addition to or in lieu of these identified processes.

It will be apparent to those skilled in the art that various modifications and variations can be made to the disclosed cutter bits. Other embodiments will be apparent to those skilled in the art from consideration of the specification. It is intended that the specification and examples be considered as exemplary only, with a true scope being indicated by the following claims and their equivalents.

What is claimed is:

1. A method for manufacturing a leading end, conical-shaped tip portion of a cutter bit using a computer-readable, three-dimensional model, wherein the computer-readable, three-dimensional model is suitable for use in manufacturing at least the leading end, conical-shaped tip portion of a cutter bit, wherein the leading end, conical-shaped tip portion includes a plurality of circumferentially-spaced ribs projecting radially outwardly from an outer peripheral surface of the leading end, conical-shaped tip portion, each rib extending rearwardly from a front end apex of the leading end, conical-shaped tip portion and including opposite side surfaces spaced from each other and projecting radially outwardly from the outer peripheral surface at an angle greater than zero degrees and less than 180 degrees relative to the outer peripheral surface, and the computer-readable three-dimensional model is created by:

inputting data representing the leading end, conical-shaped tip portion to a computer; and using the data to represent the leading end, conical-shaped tip portion as the three-dimensional model, the method for manufacturing comprising the steps of:

converting the computer-readable, three-dimensional model of the leading end, conical-shaped tip portion of the cutter bit into a plurality of slices that each define a cross-sectional layer of the leading end, conical-shaped tip portion of the cutter bit; and successively forming each layer of the leading end, conical-shaped tip portion of the cutter bit by additive manufacturing.

2. A method for manufacturing a leading end, conical-shaped tip portion of a cutter bit and a rearward, frustoconical-shaped tip portion of the cutter bit extending axially rearwardly from the leading end, conical-shaped tip portion of the cutter bit using a computer-readable, three-dimensional model, wherein the computer-readable three-dimensional model is suitable for use in manufacturing a leading end, conical-shaped tip portion of a cutter bit for a work tool and a rearward, frustoconical-shaped tip portion of the cutter bit extending axially rearwardly from the leading end, conical-shaped tip portion of the cutter bit, wherein the leading end, conical-shaped tip portion and the rearward, frustoconical-shaped tip portion include a plurality of circumferentially-spaced ribs projecting radially outwardly from an outer peripheral surface of the leading end, conical-shaped tip portion and the rearward, frustoconical-shaped tip portion, each rib extending rearwardly from a front end apex of the leading end, conical-shaped tip portion and along the length of the rearward, frustoconical-shaped tip portion and including opposite side surfaces spaced from each other and projecting radially outwardly from the outer peripheral surface at an angle greater than zero degrees and less than 180 degrees relative to the outer peripheral surface, and the computer-readable, three-dimensional model is created by:

inputting data representing the leading end, conical-shaped tip portion and the rearward, frustoconical-shaped tip portion to a computer; and using the data to represent the leading end, conical-shaped tip portion and the rearward, frustoconical-shaped tip portion as the three-dimensional model, the method for manufacturing comprising:

converting the computer-readable, three-dimensional model of the leading end, conical-shaped tip portion and the rearward, frustoconical-shaped tip portion of the cutter bit into a plurality of slices that each define a cross-sectional layer of one of the leading end, conical-shaped tip portion or the rearward, frustoconical-shaped tip portion of the cutter bit; and successively forming each layer of the leading end, conical-shaped tip portion and the rearward, frustoconical-shaped tip portion of the cutter bit by additive manufacturing.

* * * * *